United States Patent [19]
Vugts

[11] Patent Number: 4,758,321
[45] Date of Patent: Jul. 19, 1988

[54] METHOD OF SPUTTERED DEPOSITING CHROMIUM-SILICON-NITROGEN RESISTOR

[75] Inventor: Ludovicus Vugts, Eindhoven, Netherlands

[73] Assignee: U.S. Philips Corp., New York, N.Y.

[21] Appl. No.: 740,686

[22] Filed: Jun. 3, 1985

Related U.S. Application Data

[60] Continuation of Ser. No. 594,636, Mar. 29, 1984, abandoned, which is a division of Ser. No. 516,822, Jul. 25, 1983, Pat. No. 4,520,342.

[30] Foreign Application Priority Data

Aug. 24, 1982 [NL] Netherlands ........................ 8203297

[51] Int. Cl.[4] .............................................. C23C 14/34
[52] U.S. Cl. .......................... 204/192.21; 204/192.15
[58] Field of Search ............................ 29/610 R, 620; 204/192 R, 192 F, 192.15, 192.21; 219/543; 252/307, 308, 512, 513, 518, 519; 338/306, 307, 308, 309; 427/93, 94, 101, 102, 103, 124, 126.1, 294; 428/428, 432

[56] References Cited

U.S. PATENT DOCUMENTS 4,392,992 7/1983 Paulson et al. ............ 204/192 F X

OTHER PUBLICATIONS

"Sputtered Silicon-Chromium Resistive Films", J. Vacuum Science & Technology, 6, 1969, pp. 308-315, R. K. Waits.

*Primary Examiner*—John F. Niebling
*Assistant Examiner*—Nam X. Nguyen
*Attorney, Agent, or Firm*—Norman N. Spain

[57] ABSTRACT

A resistor having an insulating substrate bearing a thin layer of the alloy $CrSi_x$, where $1 \leqq x \leqq 5$ and which layer is doped with nitrogen. The doping may be spread homogeneously throughout the thickness or be concentrated in one or two thickness zones on the outside and/or on the side adjoining the substrate. As a result of the nitrogen doping an improvement of the stability of the resistor is obtained.

3 Claims, No Drawings

METHOD OF SPUTTERED DEPOSITING CHROMIUM-SILICON-NITROGEN RESISTOR

This is a continuation of application Ser. No. 594,636, filed Mar. 29, 1984, abandoned, said application Ser. No. 594,636 being a division of application Ser. No. 516,822, filed July 25, 1983, and now U.S. Pat. No. 4,520,342.

BACKGROUND OF THE INVENTION

1. Field of the Invention

The invention relates to a resistor comprising an insulating substrate on which a thin film of chromium silicon is present.

2. Description of the Prior Art

The material CrSi is particularly suitable for resistance layers having a surface resistance of 1–20 kΩ per square centimeter. With this material resistors can be made having resistances in the high-ohmic range from 100 kΩ to 10 MΩ. The resistivity of $CrSi_x$ varies with the composition and is approximately $8\times10^{-3}$ Ωcm in a composition having approximately 30 at. % Cr.

Such a resistor is known inter alia from an article by R. K. Waits in J. Vac. Sci. Techn. 6, 308–315 (1969). The most usual method of manufacturing said resistor is by sputtering the Cr-Si resistance material on the substrate which usually consists of ceramic material.

For the practical application of the compound in a resistance layer, the value of x may vary from 1–5.

A disadvantage of these resistors is that the resistance varies considerably at a temperature of 150° C., for example between +3.5 and +8% after 1,000 hours.

SUMMARY OF THE INVENTION

It is therefore an object of the invention to produce an improved stability of these chromium silicon resistors.

The resistor according to the invention is characterized in that the $CrSi_x$ layer comprises nitrogen as a dopant.

When the dopant is present throughout the layer thickness, it is present in a quantity of at least 1 at. % and at most 10 at. %.

As a result of said doping the variation of the resistance value has been reduced to less than 1% after 1,000 hours at 150° C.

A disadvantage of this doping is that the temperature coefficient of the resistor in the temperature range of −55° to +150° C. varies from weakly positive for the undoped $CrSi_x$ to rather strongly negative (up to approximately $-200\times10^{-6}$/°C.) for the nitrogen-doped material. This high temperature coefficient can be increased to above $-100\times10^{-6}$ by ageing at a temperature of approximately 450° C.

According to a further elaboration of the invention the CrSi-layer has a nitrogen doping in at least one thickness zone, on the outside and/or the side adjoining the substrate, in combination with a non-doped zone.

The advantage of this layer construction is that with a suitable mutual ratio of the layer thicknesses the temperature coefficient of the resistor (TCR) of the layer combination can be adjusted between 0 and $-100\times10^{-6}$/°C., while the stability in the case of two nitrogen-doped layers is equally good as that of a layer doped with nitrogen throughout its thickness and, in case only one layer is present, said stability is reasonably approached.

The nitrogen-doped layers on each side of the non-doped layer may, have a thickness of, for example, 30 nm, while the overall thickness of the layers may be, for example, 70–1,000 n.m. The nitrogen content of these doped layers is approximately 50 at. %. An insulating layer is formed so that it is assumed that Cr-Si-nitrides are formed.

For the manufacture of the resistors according to the invention, a layer is provided from a target of chromium silicon on the substrate by means of sputtering in an atmosphere of an inert carrier gas (for example, argon) with such a nitrogen pressure, dependent on the sputtering current and the filling of the sputtering device, that 1–10 at. % nitrogen is incorporated in the deposited material.

The addition of nitrogen to the sputtering atmosphere results in an increase of the resistance and a decrease of the variation after ageing at 350° C. At the nitrogen pressure at which the resistance value starts increasing noticeably, the temperature coefficient of resistance decreases and the resistance value becomes more stable. Too large an increase of the nitrogen pressure causes a non-reproducible resistance value to be obtained in this method. At a sputtering current of 0.5 A the maximum usable nitrogen pressure is approximately $3.3\times10^{-2}$Pa ($2.5\times10^{-4}$ Torr). At a nitrogen pressure of approximately $2\times10^{-2}$ Pa ($1.5\times10^{-4}$ Torr) it is possible to manufacture a resistor having a TCR beneath $100\times10^{-6}$/°C. and a variation of at most 0.1% after being kept at 150° C. for 80 hours.

In order to manufacture the resistors according to the preferred embodiment, the substrates are first subjected to a sputtering process with a Cr-Si-plate in an atmosphere of the inert carrier gas to which nitrogen has been added, the nitrogen addition is then discontinued while the sputtering in the undoped carrier gas proceeds and finally nitrogen is again added to the carrier gas.

For illustrating the invention, the manufacture of a series of resistors will now be described.

EXAMPLE 1

Resistors having a uniform Cr-Si-N resistance layer.

A quantity of approximately 35,000 ceramic rods having a diameter of 1.7 mm and a length of 6.5 mm were provided in a sputtering device with a sputtering plate of Cr-Si of a composition 28 at. % Cr and 72 at. % Si.

The device was first evacuated and then a mixture of argon gas and nitrogen was introduced at a pressures of 0.2 Pa ($1.5\times10^{-3}$ Torr) and 0.02 Pa ($1.5\times10^{-4}$ Torr), respectively.

The sputtering was carried out for 15 minutes with a current of 0.5 A and a voltage of −400 Volts on the sputtering plate with respect to the substrates.

The resulting resistors of 3.8 k Ohm with a standard deviation of ±20% and which were doped with 6 at. % nitrogen were heated at 450° C. for 4 hours. The TCR of the resistors was approximately $-90\times10^{-6}$/°C.

The resistors were subjected to a test consisting of being kept at 150° C. for 80 hours in air. The variation in the resistance value resulting from this test was less than 0.1%.

EXAMPLE 2

A quantity of approximately 35,000 ceramic rods of the same dimensions as in Example 1 were provided in the same sputtering device.

After evacuating the device a mixture of argon and nitrogen was introduced at pressures of 0.2 Pa ($1.5\times10^{-3}$ Torr) and $1.06\times10^{-3}$ Pa ($8\times10^{-4}$ Torr), respectively. The sputtering was carried out at a current strength of 1 A and a voltage of −400 V on the sputtering plate with respect to the substrates for 7½ minutes. The nitrogen was then omitted from the gas current and sputtered in an atmosphere of only argon at a pressure of 0.2 Pa ($1.5\times10^{-3}$ Torr). The sputtering in said atmosphere with a current strength of 0.4 A was continued for 10 minutes. Finally nitrogen was again introduced into the gas flow to the same pressure and sputtered with the same current strength and for the same period of time as stated for the first layer. Resistors were obtained with a resistance value of 9.4 k Ohm±20%. The TCR of said resistors was $-30\times10^{-6}$/°C. after ageing at 350° C. for 3 hours. The nitrogen doping in the inner layer and in the outer layer was 50 at. %.

The resistors were subjected to a test by heating them at 150° C. for 160 hours. The variation in the resistance value as a result of said test was 0.1%.

A part of the resistors according to Examples 1 and 2 was completed by providing them with connection caps and wires, trimming them with a laser to values 3 and 7 M Ohm respectively and finally painting them. When said resistors were heated at 150° C. for 1000 hours, they showed a variation of 0.85% for resistors of example 1 and 0.75% for resistors of Example 2, respectively.

What is claimed is:

1. A method of manufacturing a resistor having an insulating substrate provided with a thin layer of the basic composition $CrSi_x$ wherein $1\leqq x\leqq5$, comprising the steps of:

first subjecting the insulating substrate to sputtering from a target of chromium silicon in an atmosphere of an inert gas to which nitrogen has been added; and then discontinuing the supply of nitrogen to the inert gas while continuing sputtering in said inert gas, thus providing said substrate with an adjacent nitrogen doped $CrSi_x$ layer and an undoped $CrSi_x$ layer adjacent to said doped $CrSi_x$ layer.

2. A method of manufacturing a resistor having an insulating substrate provided with a thin layer of the basic composition $CrSi_x$ wherein $1\leqq x\leqq5$, comprising the steps of:

first subjecting the insulating substrate to sputtering from a target of chromium silicon in an atmosphere of an inert gas and then adding a supply of nitrogen to said inert gas while continuing said sputtering, thus providing said substrate with an adjacent undoped $CrSi_x$ layer and a nitrogen doped $CrSi_x$ layer adjacent to said undoped $CrSi_x$ layer.

3. A method of manufacturing a resistor having an insulating substrate provided with a thin layer having the basic composition $CrSi_x$ in which $1\leqq X\leqq5$, comprising the steps of:

first subjecting the substrate to sputtering from a chromium silicon target in an atmosphere of an inert gas to which nitrogen has been added;

discontinuing the supply of nitrogen to said inert gas while continuing said sputtering; and then supplying nitrogen again to said inert gas while continuing said sputtering, thus providing said substrate with a first adjacent nitrogen doped $CrSi_x$ layer, an intermediate undoped $CrSi_x$ layer and second nitrogen doped $CrSi_x$ layer adjacent to said intermediate undoped $CrSi_x$ layer.

* * * * *